(12) United States Patent
Kang et al.

(10) Patent No.: US 12,393,351 B2
(45) Date of Patent: Aug. 19, 2025

(54) MEMORY DEVICE, MEMORY SYSTEM AND METHOD FOR OPERATING MEMORY SYSTEM

(71) Applicant: SAMSUNG ELECTRONICS CO., LTD., Suwon-si (KR)

(72) Inventors: Sang-Kyu Kang, Suwon-si (KR); Jieun Shin, Suwon-si (KR); Ho-Cheol Bang, Suwon-si (KR); Haewon Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 48 days.

(21) Appl. No.: 18/199,566

(22) Filed: May 19, 2023

(65) Prior Publication Data
US 2024/0111433 A1    Apr. 4, 2024

(30) Foreign Application Priority Data
Sep. 30, 2022 (KR) .......................... 10-2022-0125222

(51) Int. Cl.
*G06F 3/06* (2006.01)

(52) U.S. Cl.
CPC ............ *G06F 3/0619* (2013.01); *G06F 3/061* (2013.01); *G06F 3/0653* (2013.01); *G06F 3/0658* (2013.01); *G06F 3/0673* (2013.01)

(58) Field of Classification Search
CPC ....... G11C 7/22; G11C 7/222; G11C 11/4076; G11C 2207/2254; G11C 29/028; G11C 29/023; G11C 29/50012; G11C 29/022; G11C 8/18; G06F 1/10; G06F 1/08; G06F 13/1689; G06F 3/0619; G06F 3/0653; G06F 3/0673; G06F 3/0659; G06F 3/0679; G06F 3/061; G06F 3/0629; G06F 3/0658; G06F 3/0671; G06F 3/0614; G06F 2212/1032
See application file for complete search history.

(56) References Cited

U.S. PATENT DOCUMENTS 6,795,354 B2   9/2004 Cho et al.
7,489,586 B2 *  2/2009 Oh .......................... G11C 7/22
                                                   365/194

(Continued)

FOREIGN PATENT DOCUMENTS

JP          3352915 B2    12/2002
KR    10-2007-0055099 A    5/2007

*Primary Examiner* — Curtis James Kortman
(74) *Attorney, Agent, or Firm* — Sughrue Mion, PLLC

(57) ABSTRACT

In some embodiments, a memory system includes a memory device and a host configured to transmit, to the memory device, a command and address (C/A) signal and a clock signal, and to transmit or receive data signals to or from the memory device. Each command that is configured to access the memory device is associated with an access timing parameter. The memory device includes an access parameter timer configured to measure an actual timing value of the access timing parameter, a spec register configured to provide a spec timing value defining an effective timing of the access timing parameter, a comparison circuit configured to compare the actual timing value and the spec timing value, and a mode register configured to store an access timing violation flag that is read by the host when the actual timing value deviates from the spec timing value by exceeding a predetermined range.

19 Claims, 11 Drawing Sheets

(56) References Cited

U.S. PATENT DOCUMENTS

| | | | |
|---|---|---|---|
| 8,711,649 B2 | 4/2014 | Kim et al. | |
| 8,751,836 B1 | 6/2014 | Piszczek et al. | |
| 9,223,642 B2 | 12/2015 | Yu et al. | |
| 11,035,940 B2 | 6/2021 | Xu et al. | |
| 11,164,620 B1 * | 11/2021 | Kim | G11C 11/4087 |
| 11,354,064 B2 | 6/2022 | Richter et al. | |
| 11,675,716 B2 * | 6/2023 | Mozak | G06F 13/1694 |
| | | | 711/154 |
| 2014/0359242 A1 * | 12/2014 | Son | G06F 13/1689 |
| | | | 711/167 |
| 2016/0034206 A1 * | 2/2016 | Ryan | G06F 3/064 |
| | | | 711/103 |
| 2022/0113349 A1 * | 4/2022 | Callaghan | G11C 29/20 |

* cited by examiner

MR26(RFU)

| OP7 | OP6 | OP5 | OP4 | OP3 | OP2 | OP1 | OP0 |
|-----|-----|-----|-----|-----|-----|-----|-----|
| Flag Select Option | | | | Violations according to Major AC Specs | | | |

FIG. 4

| Function | Register Type | Operand | Data |
|---|---|---|---|
| AC timing Parameter Compliant check | Read only | OP[3:0] | 0000 b : All timing is compliant to the spec.<br>0001 b : tZQCAL violation<br>0010 b : tZQLAT violation<br>... :<br>0101 b : tINT1 violation<br>0110 b : tRCDW violation<br>1111 b : tXP violation |
| | Write only | OP[7:4] | 0000 b : Ch. A DQ0 consecutive "1" output<br>0001 b : Ch. A DQ1/3/5/7 consecutive "1" output<br>0010 b : Ch. A/B DQ0/15 consecutive "0" output<br>0011 b : ...<br>0100 b : ...<br>0101 b : ...<br>0110 b : ...<br>... :<br>1111 b : None |

MR27(RFU)

| OP7 | OP6 | OP5 | OP4 | OP3 | OP2 | OP1 | OP0 |
|-----|-----|-----|-----|-----|-----|-----|-----|
| Time delta in case of AC#2 violation (AC#2 = tXP) | | | | Time delta in case of AC#1 violation (AC#1 = ZQ cal) | | | |

FIG. 8

| Function | Register Type | Operand | Data |
|---|---|---|---|
| Memory Device Timing check | Read only | OP[3:0] | 0000 b : +100%<br>0001 b : +90%<br>0010 b : +80%<br>...<br>0101 b : −90%<br>0110 b : −100%<br>1111 b : delta limit exceeded |
| | Read only | OP[7:4] | 0000 b : +100%<br>0001 b : +90%<br>0010 b : +80%<br>...<br>0101 b : −90%<br>0110 b : −100%<br>1111 b : delta limit exceeded |

MEMORY DEVICE, MEMORY SYSTEM AND METHOD FOR OPERATING MEMORY SYSTEM

CROSS-REFERENCE TO RELATED APPLICATIONS

This application claims benefit of priority under 35 U.S.C. § 119 to Korean Patent Application No. 10-2022-0125222, filed on Sep. 30, 2022, in the Korean Intellectual Property Office, the disclosure of which is incorporated by reference herein in its entirety.

BACKGROUND

1. Field

The present disclosure relates to a memory device, a memory system, and a method for operating the memory system.

2. Description of the Related Art

A memory device may be classified into a volatile memory device and a non-volatile memory device. The volatile memory device may be a memory device in which data stored therein may be lost when power supplied to the volatile memory device is cut off. A nonvolatile memory device may be a memory device that may retain data stored therein when power supplied to the nonvolatile memory device is cut off. Examples of volatile memory devices may include, but not be limited to, random access memory (RAM), static RAM (SRAM), dynamic RAM (DRAM), and synchronous DRAM (SDRAM). Examples of non-volatile memory devices may include, but not be limited to, read-only memory (ROM), programmable ROM (PROM), electrically programmable ROM (EPROM), electrically erasable and programmable ROM (EEPROM), a flash memory device, phase-change RAM (PRAM), magnetic RAM (MRAM), resistive RAM (RRAM), ferroelectric RAM (FRAM), and the like.

In order to support a high-speed interface with the memory device, it may be necessary for a host or a memory controller to manage timing of commands to access the memory device or to perform training or calibration.

SUMMARY

Embodiments of the present disclosure provide a memory device, a memory system, and a method for operating the memory system that may monitor timing violations and correct them during detection.

According to an aspect of the present disclosure, a memory system is provided. The memory system includes a memory device and a host configured. The host is configured to transmit, to the memory device, a command and address (C/A) signal and a clock signal. The host is further configured to transmit, to the memory device, a first data signal. The host is further configured to receive, from the memory device, a second data signal. Each command that is configured to access the memory device is associated with an access timing parameter. The memory device includes an access parameter timer configured to measure an actual timing value of the access timing parameter, a spec register configured to provide a spec timing value defining an effective timing of the access timing parameter, a comparison circuit configured to compare the actual timing value and the spec timing value, and a mode register configured to store an access timing violation flag that is read by the host when the actual timing value deviates from the spec timing value by exceeding a predetermined range.

According to an aspect of the present disclosure, an operation method of a memory system is provided. The operation method includes performing, by a memory device of the memory system, a normal operation. The operation method further includes measuring an actual timing value for an access timing parameter in relation to timing assigned to each command that is configured to access the memory device. The operation method further includes receiving a spec timing value defining an effective timing of the access timing parameter. The operation method further includes comparing the actual timing value and the spec timing value. The operation method further includes storing, in a mode register of the memory system, a result of the comparing of the actual timing value and the spec timing value.

According to an aspect of the present disclosure, a memory device is provided. The memory device includes an access parameter timer configured to measure an actual timing value of an access timing parameter, a spec register configured to provide a spec timing value defining an effective timing of the access timing parameter, a comparison circuit configured to compare the actual timing value and the spec timing value, a first mode register configured to store a first value indicating violation details of a first command in which a timing violation has occurred, when the timing violation has occurred, and a second mode register configured to store a second value indicating a second command that induces a predetermined operation of the memory device according to the timing violation. The memory device is configured to receive, from a host, a C/A signal and a clock signal. The memory device is further configured to transmit, to the host, a first data signal. The memory device is further configured to receive, from the host, a second data signal with the host. Each command that is configured to access the memory device is associated with a corresponding access timing parameter.

BRIEF DESCRIPTION OF DRAWINGS

The above and other aspects, features, and advantages of certain embodiments of the present disclosure will be more apparent from the following description taken in conjunction with the accompanying drawings, in which:

FIGS. 3 and 4 are views showing an example of an implementation of a memory device, according to an embodiment;

FIGS. 7 and 8 are views showing an example of an implementation of a memory device, according to an embodiment;

DETAILED DESCRIPTION

Figure 1:
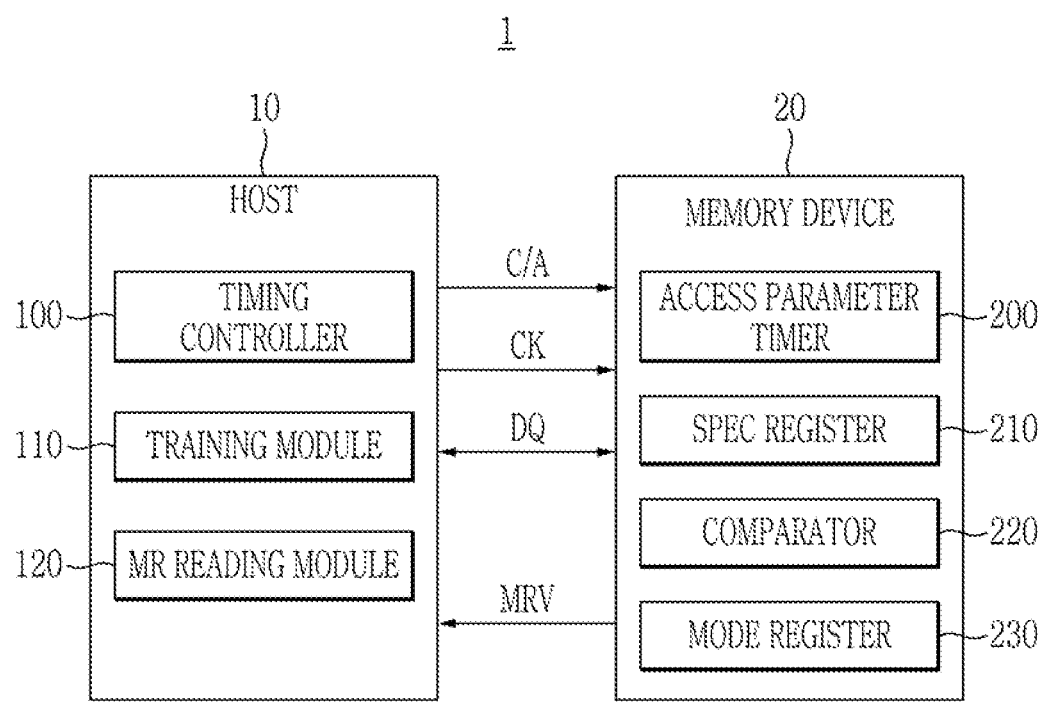
FIG. 1 is a block diagram showing a memory system, according to an embodiment.

In the following detailed description, only certain embodiments of the present disclosure have been shown and described, simply by way of illustration. As those skilled in the art would realize, the described embodiments may be modified in various different ways, all without departing from the spirit or scope of the present disclosure.

Accordingly, the drawings and description are to be regarded as illustrative in nature and not restrictive. Like reference numerals designate like elements throughout the present disclosure.

In addition, a singular form may be intended to include a plural form as well, unless the explicit expression such as "one" or "single" is used. Terms including ordinal numbers such as first, second, and the like will be used only to describe various constituent elements, and are not to be interpreted as limiting these constituent elements. These terms may be used for a purpose of distinguishing one constituent element from other constituent elements.

As used herein, each of such phrases as "A or B," "at least one of A and B," "at least one of A or B," "A, B, or C," "at least one of A, B, and C," and "at least one of A, B, or C," may include any one of possible combinations of the items enumerated together in a corresponding one of the phrases. It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wired), wirelessly, or via a third element.

Reference throughout the present disclosure to "one embodiment," "an embodiment," "an example embodiment," or similar language may indicate that a particular feature, structure, or characteristic described in connection with the indicated embodiment is included in at least one embodiment of the present solution. Thus, the phrases "in one embodiment", "in an embodiment," "in an example embodiment," and similar language throughout this disclosure may, but do not necessarily, all refer to the same embodiment.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

FIG. 1 is a block diagram showing a memory system, according to an embodiment.

Referring to FIG. 1, a memory system 1, according to an embodiment, may include a host 10 and a memory device 20.

The host 10 may be a device configured to transmit an access request for the memory device 20 and to access data in response thereto. In some embodiments, the host 10 may include a processor, a central processing unit (CPU), a graphics processing unit (GPU), an intellectual property (IP) core, and the like. Alternatively or additionally, in some embodiments, the host 10 may be a memory controller.

The memory device 20 may include a memory cell array including a plurality of memory cells. In an embodiment, the memory cell may be a volatile memory cell. For example, the memory device 20 may include, but not be limited to, a random access memory (RAM), a dynamic RAM (DRAM), a static RAM (SRAM), a mobile DRAM, a synchronous DRAM (SDRAM), a double data rate (DDR) SDRAM, a low power DDR (LPDDR) SDRAM, a graphics DDR (GDDR) SDRAM, a Rambus DRAM (RDRAM), or the like. In an optional or additional embodiment, the memory cell may be a non-volatile memory cell. For example, the memory device 20 may include, but not be limited to, a read-only memory (ROM), a programmable ROM (PROM), an electrically programmable ROM (EPROM), an electrically erasable and programmable ROM (EEPROM), a flash memory, a phase-change RAM (PRAM), a resistive RAM (RRAM), a nano floating gate memory (NFGM), a polymer RAM (PoRAM), a magnetic RAM (MRAM), a ferroelectric RAM (FRAM), and the like. Hereinafter, the memory device 20 may be described as a DRAM, but the technical spirit of the present disclosure is not limited thereto.

As the storage capacity of the memory device 20 increases and the operation speed of devices accessing the memory device 20 increases, the host 10 and the memory device 20 may support a high-speed interface to meet the demand for high-speed transmission. The host 10 may transmit various signals to the memory device 20, for example, an address signal, a control signal, and the like. In order to transmit and receive accurate data between the host 10 and the memory device 20, the host 10 may perform training for the command and address (C/A) signal based on the clock (CK) signal.

The host 10 may transmit the C/A signal and the CK signal to the memory device 20, and may transmit and/or receive a data (DQ) signal to and/or from the memory device 20. For example, the CK signal may be transmitted to the memory device 20 through a clock line provided between the host 10 and the memory device 20. The memory device 20 may capture, according to the CK signal received from the host 10, the C/A signal, the DQ signal, and the like. Alternatively or additionally, the memory device 20 may transmit, to the host 10, the DQ signal synchronized to the CK signal, thereby allowing the host 10 to capture the DQ signal. In some embodiments, the memory device 20 may be operated in synchronization with a rising edge of the CK signal. In optional or additional embodiments, the memory device 20 may be operated in synchronization with a falling edge of the CK signal.

In order to capture the C/A signal, the DQ signal, and the like, by using the CK signal operating at high speed, the host 10 may train the C/A signal for the CK signal. Alternatively or additionally, the host 10 may receive the response of the memory device 20 for the trained C/A signal. The host 10 may adjust transmission timing and/or delay of the signal transmitted to the memory device 20 according to the response received from the memory device 20. For example, the host 10 may transmit a specific command to the memory device 20 through a command bus, and determine whether the DQ signal transmitted through the data bus at the rising edge and/or the falling edge of the CK signal is accurately captured by the memory device 20. Such training may be entered when power is supplied to the memory system 1 or when a specific condition is satisfied.

For example, in a product equipped with a chipset, it may be necessary to perform timing verification of the chipset in advance. That is, if the timing verification of the chipset is not completed before the manufacturing of the product, defects in the product may remain undetected. For at least this reason, aspects of the present disclosure provide for monitoring whether a timing violation occurs and correcting the timing violation when the timing violation is detected so that the chipset may reliably guarantee high-speed interface support with the memory device 20 before being applied to the product.

In an embodiment, the host 10 may include a timing controller 100, a training module 110, and a mode register reading module 120. Alternatively or additionally, the memory device 20 may include an access parameter timer 200, a spec register 210, a comparison circuit 220, and a mode register 230.

The timing controller 100 may be configured to control transmission timing of signals transmitted by the host 10 to the memory device 20, such as, but not limited to, the C/A signal and the DQ signal. In some embodiments, the timing controller 100 may initially determine the transmission timing according to a predetermined value in advance, and then adjust the transmission timing by reflecting a training result provided from the training module 110.

The training module 110 may be configured to detect delay changes and to perform training to improve a capture accuracy of the signals (e.g., C/A signal, CK signal) that are transmitted by the host 10 to the memory device 20. In an embodiment, the training module 110 may start the operation in a predetermined condition and/or situation (e.g., when the power is turned on, when an error occurs in a specific signal, and the like).

The mode register reading module 120 may be configured to periodically read the mode register 230 of the memory device 20 to receive the mode register value MRV. The mode register reading module 120 may be further configured to recognize whether the timing of the command transmitted by the host 10 to the memory device 20 has been violated (e.g., the timing is invalid and/or out of spec). In some embodiments, the mode register reading module 120 may read the mode register 230 periodically according to a predetermined period. In optional or additional embodiments, the mode register reading module 120 may read the mode register 230 aperiodically, for example, when an event occurs. After recognizing the timing violation in this way, the host 10 may control the transmission timing of the signals (e.g., the C/A signal, the CK signal).

The access parameter timer 200 may be configured to measure the actual timing value of the access timing parameter. In the present disclosure, the access timing parameter may refer to a parameter related to the timing given for each command to access the memory device 20. To this end, the access parameter timer 200 may include a detection element including at least one timer, counter, and/or combination thereof. That is, the access parameter timer 200 may measure the actual timing value of the command generated on the memory device 20.

The spec register 210 may be configured to provide a spec timing value. In the present disclosure, the spec timing value may identify an effective timing for the access timing parameter. For example, the effective timing identified for a certain command may indicate a range in which the timing violation does not occur when the memory device 20 executes the corresponding command.

The comparison circuit 220 may be configured to compare the actual timing value measured from the access parameter timer 200 with the spec timing value provided from the spec register 210. That is, the comparison circuit 220 may determine whether the actual timing value for the execution of a certain command deviates by exceeding the spec timing value for the corresponding command. In some embodiments, the comparison circuit 220 may determine whether the actual timing value for the execution of a certain command deviates from a spec timing value for the corresponding command by exceeding a predetermined range.

The mode register 230 may be configured to store an access timing violation flag. The access timing violation flag stored in the mode register 230 may be read by the host 10. In some embodiments, the access timing violation flag may indicate the details of the violation of the command in which the timing violation occurred. In optional or additional embodiments, according to a specific implementation purpose, the access timing violation flag may be implemented in other forms. For example, the access timing violation flag may indicate a command that induces a predetermined operation of the memory device 20 when a timing violation occurs. Alternatively or additionally, the access timing violation flag may include a time delta value for controlling the timing operation of the memory device 20 according to the timing violation.

In some embodiments, depending on the region in which the access timing violation flag is stored, some regions of the mode register 230 may be set to read-only and/or write-only. For example, the access timing violation flag that displays the details of the violation of the command in which the timing violation occurred may be set as read-only. For another example, when the timing violation occurs, the access timing violation flag that displays the command for inducing a predetermined operation of the memory device 20 may be set as write-only. For another example, the access timing violation flag including the time delta value for controlling the timing operation of the memory device 20 according to the timing violation may be set as read-only. That is, the access setting of the access timing violation flag is not limited by the present disclosure. That is, the access setting of the access timing violation flag may vary depending on a specific implementation purpose.

Figure 2:
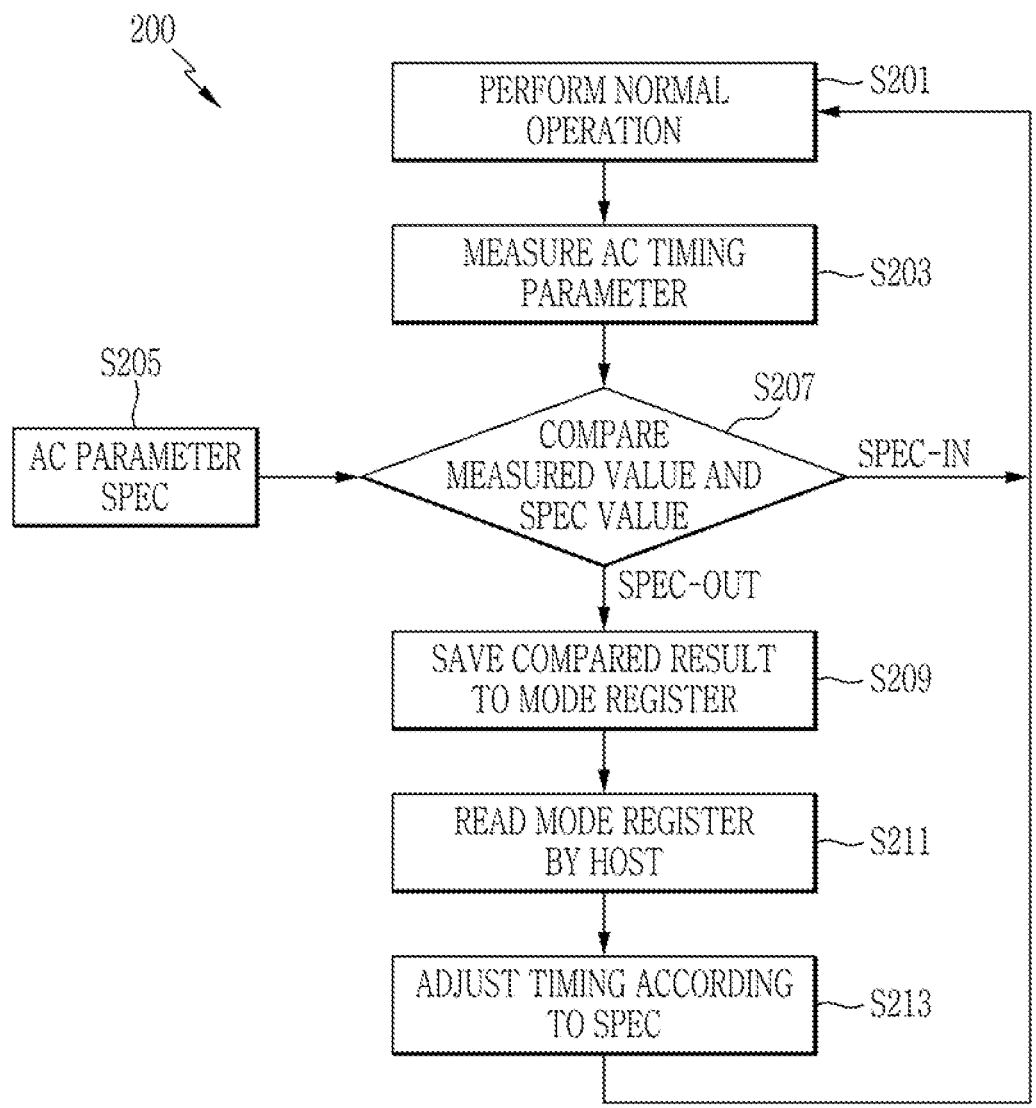
FIG. 2 is a flowchart showing an operation method of a memory system, according to an embodiment.

FIG. 2 is a flowchart representing an operation method, according to an embodiment.

Referring to FIG. 2, in the operation method 200 of the memory system 1, according to an embodiment, the memory device 20 may perform a normal operation in step S201. For example, a normal operation may include, but not be limited to, a memory read operation, a memory write operation, and the like. The actual timing value for the access timing parameter for the timing given for each command to access the memory device 20 may be measured in step S203. The method 200 may be provided with a spec timing value identifying the effective timing for the access timing parameter in step S205.

Next, the method 200 may compare the measured actual timing value and the spec timing value in step S207. Based on the comparison, the memory device 20 may determine whether it is in a spec-in state or a spec-out state. The memory device 20 may determine that it is in the spec-in state when the actual timing value is included within the effective timing range. Alternatively or additionally, the memory device 20 may determine that it is in the spec-out state when the actual timing value is out of the effective timing range. When the memory device 20 determines that it is in the spec-in state (e.g., SPEC-IN at step S207), the method 200 may proceed to step S201 so that the memory device 20 may continue to perform the normal operation.

Alternatively or additionally, when the memory device 20 determines that it is in the spec-out state (e.g., SPEC-OUT at step S207), the method 200 may store the result of comparing the actual timing value and the spec timing value in the mode register 230 in the step S209. The result of comparing the actual timing value and the spec timing value may be stored in the mode register 230 in various ways. For example, the comparison result may include at least one of a value indicating the details of the violation of the command in which the timing violation occurred, a value indicating the command inducing the predetermined operation of the memory device 20 when the timing violation occurred, and a time delta value for controlling the timing operation of the memory device 20 according to the timing violation.

Next, in step S211 of the method 200, the host 10 may periodically and/or aperiodically read the mode register 230 to recognize whether the timing violation has occurred. Alternatively or additionally, the host 10 may adjust the timing to meet to the spec defining the effective timing in step S213. Thereafter, the method 200 may proceed to step S201 so that the memory device 20 may continue to perform the normal operation.

According to the present embodiment, it may be possible to monitor whether the timing violation occurs in the chipset or not, and to correct the timing violation when the timing violation is detected, so that high-speed interface support with the memory device 20 may be guaranteed in advance before the chipset is applied to a product. Accordingly, it may be possible to prevent defects in the product on which the corresponding chipset is mounted in advance.

FIGS. 3 and 4 are views showing an example of an implementation of a memory device according to an embodiment.

Referring to FIG. 3, the mode register 230 of the memory device 20, according to an embodiment, may include an operand field of OP[0:7]. The operand field of OP[0:7] may be defined in the mode register 230 of the memory device 20 with a predetermined size. In some embodiments, OP[0:3] of OP[0:7] may correspond to a value (e.g., a flag) indicating whether the violation occurs for each major access timing spec, and OP[0:4] of OP[0:7] may correspond to a value for the flag selection option.

Referring to FIG. 4, the operand field of OP[3:0] may be set as read-only, and a value indicating the violation details of the command in which the timing violation occurred may be stored as the value (e.g., OP[7:4]). For example, in the operand field of OP[3:0], a binary value of "0000" may indicate that all timings are within spec (e.g., all timing is compliant to the spec), a binary value of "0001" may indicate that the tZQCAL timing is violated (e.g., out of spec), a binary value of "0010" may indicate that the tZQLAT timing is violated, a binary value of "0101" may indicate that the tINT1 timing is violated, a binary value of "0110" may indicate that the tRCDW timing is violated, and a binary value of "1111" may indicate that the tXP timing is violated may be stored. The tZQCAL timing, the tZQLAT timing, the tINT1 timing, the tRCDW timing, the tXP timing, and the like, may be timing values required for commands to be performed normally (e.g., within spec) in the memory device 20. The host 10 may read the mode register 230 and may recognize the details where the timing violation occurs according to the value recorded in the mode register 230.

The operand field of the OP[7:4] may be set to right only, and a value indicating the command for inducing a predetermined operation of the memory device 20 may be stored as the value. For example, in the operand field of OP[7:4], a binary value of "0000", which specifies the command to output a continuous "1" to the DQ0 port of a channel A when the timing violation occurs, may be stored through the memory device 20. For another example, a binary value of "0001", which specifies the command to output a continuous "1" to the DQ1/3/5/7 port of the channel A by the memory device 20 when the timing violation occurs, may be stored. For another example, a binary value of "0010", which specifies the command to output a consecutive "0" to the DQ0/15 port of the channel A/B by the memory device 20 when the timing violation occurs, may be stored. In this way, the command that induces the predetermined operation of the memory device 20 may be recorded by the host 10 in the mode register 230, and then, when the timing violation actually occurs, the memory device 20 may perform the operation according to what is defined in the operand field of OP[7:4]. For example, when the timing violation occurs, the memory device 20 outputs the continuous "1" to the DQ0 port of the channel A, and other constituent elements inside the host 10 or the memory device 20 may monitor the DQ0 port of the channel A and recognize that the timing violation has occurred when it is detected that the continuous "1" is output.

Figure 5:
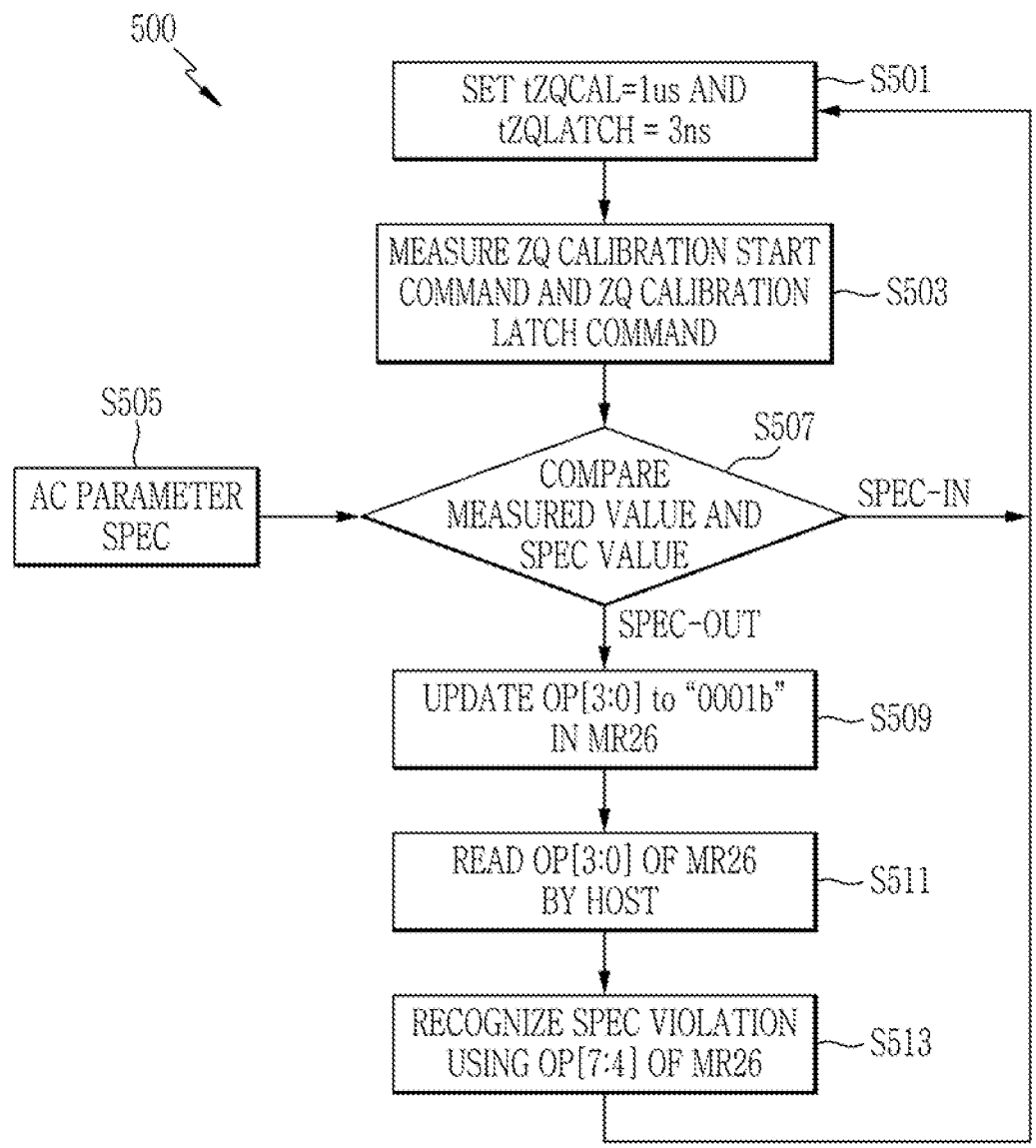
FIG. 5 is a flowchart showing an operation method of a memory system, according to an embodiment.

FIG. 5 is a flowchart showing an operation method of a memory system, according to an embodiment.

Referring to FIG. 5, a memory system 1, according to an embodiment, may be operated using the mode register 230 illustrated in FIGS. 3 and 4, and the operation method 500 thereof, which is described in relation to a ZQ calibration. The ZQ calibration may refer to a training method used to reduce an impedance mismatch between the DRAM controller and the DRAM, and, as such, improve input/output (I/O) characteristics of the memory system 1. It is to be understood that the present disclosure is not limited in this regard. That is, other training methods may be utilized to reduce an impedance mismatch between the DRAM controller and the DRAM and to improve the I/O characteristics of the memory system 1.

The ZQ calibration may be performed at the time of a system initialization, and/or may be performed periodically according to a predetermined period in advance. In some embodiments, a ZQ calibration time (e.g., tZQCAL) may have a minimum value (e.g., 1 microsecond (μs)) that may need to be guaranteed. For example, if tZQCAL does not comply with the minimum value, the I/O characteristics of the memory system 1 may deteriorate, and, as such, the host 10 may need to monitor whether tZQCAL complies with the minimum value.

The operation method 500 of the memory system 1, according to an embodiment, may set the minimum value that may need to be guaranteed for tZQCAL (e.g., 1 μs) and set the minimum value that may need to be guaranteed for a ZQ latch time (tZQLATCH) (e.g., 3 nanoseconds (ns)) in step S501. In some embodiments, the predetermined minimum values for tZQCAL and tZQLATCH may be stored in the spec register 210 as spec timing values.

The method 500, in step S503, may detect timing of a ZQ calibration start command and timing of a ZQ calibration latch command, thereby measuring the actual timing values for the access timing parameters. The method 500 may receive spec timing values (e.g., tZQCAL=1 μs, tZQLATCH=3 ns) defining the effective timing for the access timing parameter in step S505.

Next, the method 500 may compare the measured actual timing value and the spec timing value in step S507. Based on the comparison, the memory device 20 may determine whether it is in a spec-in state or a spec-out state. The memory device 20 may determine that it is in the spec-in state when the actual timing value is included within the effective timing range. Alternatively or additionally, the memory device 20 may determine that it is in the spec-out state when the actual timing value is out of the effective timing range.

When the memory device 20 determines that it is in the spec-in state (e.g., SPEC-IN at step S507), the method 500 may proceed to step S501 may continue to perform the ZQ calibration. Alternatively or additionally, when the memory device 20 determines that it is in the spec-out state (e.g., SPEC-OUT at step S507), the method 500 may store the result of comparing the actual timing value and the spec timing value in the mode register 230 in step S509. For example, the result of comparing the actual timing value and the spec timing value may be stored as the binary value "0001" in OP[3:0] of the mode register (e.g., mode register 230 of FIGS. 3 and 4).

Next, the method 500, in step S511, may read OP[3:0] of the mode register 230 periodically and/or aperiodically through the host 10 to recognize whether the timing is violated. In step S513, the method 500 may recognize whether the timing violation has occurred from the operation performed by the memory device 20 operated by using OP[7:4] of the mode register 230. Thereafter, the method 500 may proceed to step S501 so that the memory device 20 may continue to perform the ZQ calibration.

Figure 6:
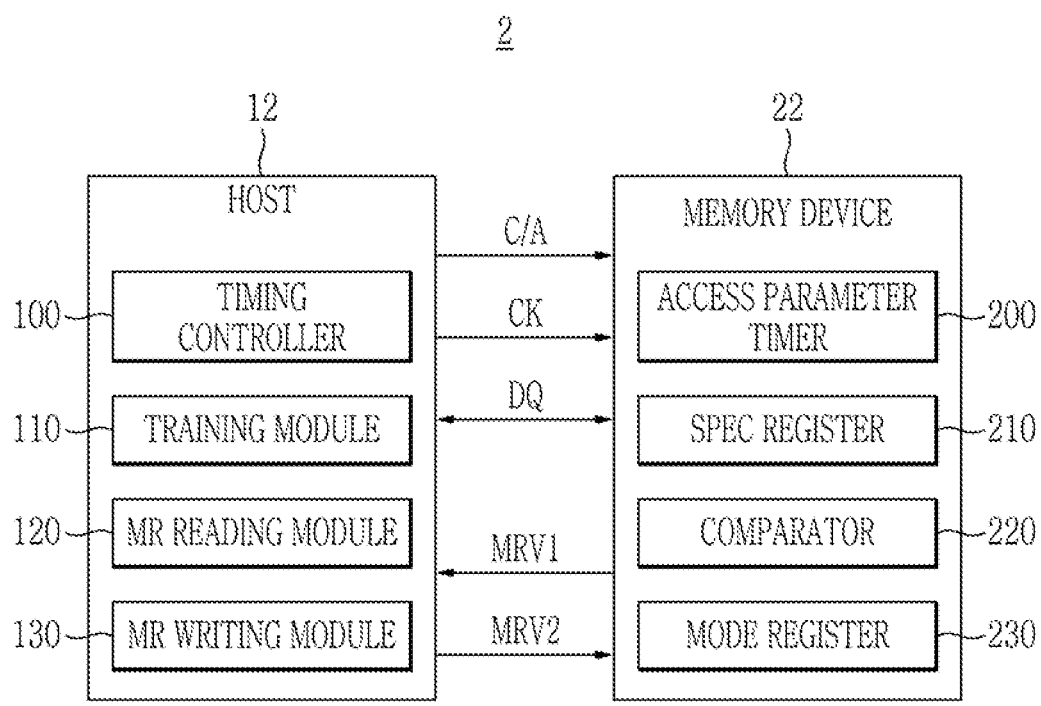
FIG. 6 is a block diagram showing a memory system, according to an embodiment.

FIG. 6 is a block diagram showing a memory system, according to an embodiment.

Referring to FIG. 6, a memory system 2 according to an embodiment may include a host 12 and a memory device 22. Host 12 may include or may be similar in many respects to the host 10 described above with reference to FIGS. 1-5 and may include additional features not mentioned above. Furthermore, memory device 22 may include or may be similar in many respects to the memory device 20 described above with reference to FIGS. 1-5 and may include additional features not mentioned above.

In an embodiment, the host 12 may include a timing controller 100, a training module 110, a mode register reading module 120, and a mode register recording module 130. Alternatively or additionally, the memory device 22 may include an access parameter timer 200, a spec register 210, a comparison circuit 220, and a mode register 230. The timing controller 100, the training module 110, the access parameter timer 200, the spec register 210, and the comparison circuit 220, may include or may be similar in many respects to the timing controller 100, the training module 110, the access parameter timer 200, the spec register 210, and the comparison circuit 220, respectively, described above with reference to FIGS. 1-5 and thus the redundant description is omitted here.

The mode register reading module 120 may be configured to periodically read the mode register 230 of the memory device 22 to receive the mode register value MRV1. The mode register reading module 120 may be further configured to recognize whether the timing of the command transmitted by the host 12 to the memory device 22 is violated (e.g., out of spec) from the corresponding value. The value MRV1 may include, for example, a value indicating the violation details of the command in which the timing violation occurred. The mode register 230 may include a first mode register (not shown), and the value MRV1 may be stored in the first mode register.

The mode register recording module 130 may be configured to record the value MRV2 including the command to control the operation of the memory device 22 in the mode register 230 of the memory device 22. The value MRV2 may include, for example, a value indicating the command for inducing a predetermined operation of the memory device according to the timing violation. The mode register 230 may include a second mode register (not shown), and the value MRV2 may be stored in the second mode register. In some embodiments, the predetermined operation may include an operation of continuously outputting a predetermined value in a predetermined channel and port.

In some embodiments, the mode register 230 may include a third mode register (not shown), and a time delta value for controlling the timing operation of the memory device 22 according to the timing violation may be stored in the third mode register. In some embodiments, the time delta value may be set as a percentage value. Such a time delta value may be a predetermined value in the memory device 22, or a value set by the host 12 during the operation of the memory device 22.

FIGS. 7 and 8 are views showing an example of an implementation of a memory device according to an embodiment.

Referring to FIG. 7, the mode register 230 of the memory device 22, according to an embodiment, may include the operand field of OP[0:7]. The operand field of OP[0:7] may be defined in the mode register 230 of the memory device 22 with a predetermined size. In some embodiments, OP[0:3] among OP[0:7] may correspond to a value indicating a time delta when the first access timing spec (e.g., an access timing spec related to ZQ calibration) is violated, and OP[7:4] among OP[0:7] may correspond to a value indicating a time delta when the second access timing spec (e.g., an access timing spec related to tXP) is violated. In the present disclosure, the time delta may refer to a value indicating how much the actual timing is deviated with reference to the spec, or may refer to a value indicating an amount to be adjusted to resolve the timing violation.

Referring to FIG. 8, the operand field of OP[3:0] may be set as read-only, and a value representing the time delta during the timing violation may be stored as the value. For example, in the operand field of OP[3:0], a binary value of "0000" may represent a delta of +100%, a binary value of "0001" may represent a delta of +90%, a binary value of "0010" may represent a delta of +80%, a binary value of "0101" may represent a delta of −90%, a binary value of "0110" may represent a delta of −100%, and a binary value of "1111" may indicate a case where a limit value of the delta is exceeded. The host 12, the memory device 22, or other constituent elements inside the memory device 22 may recognize the degree to which the actual timing is deviated with reference to the spec based on these stored values. The operand field of OP[7:4] may also be operated in a similar way to the operand field of OP[3:0].

Figure 9:
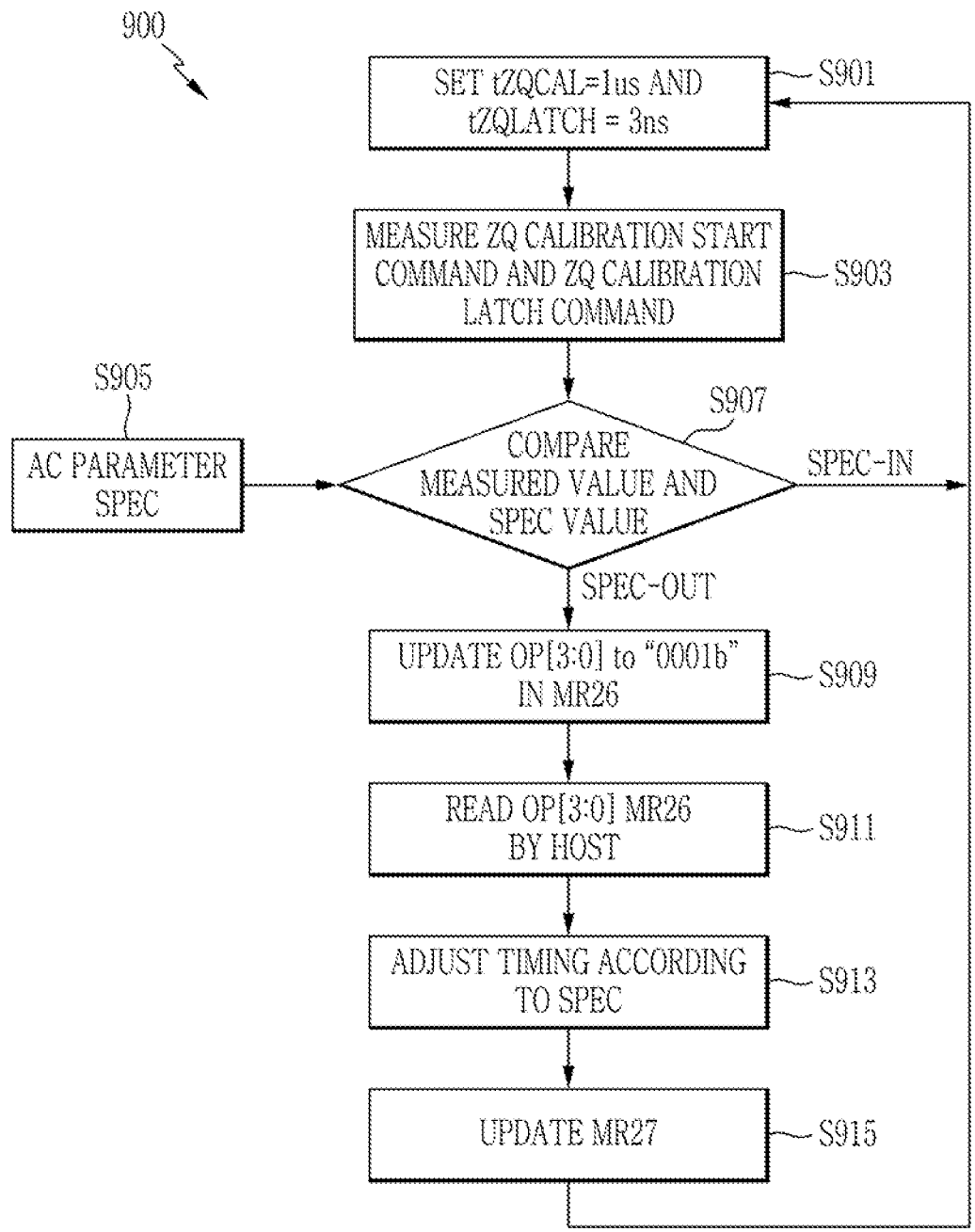
FIG. 9 is a flowchart showing an operation method of a memory system, according to an embodiment.

FIG. 9 is a flowchart showing an operation method of a memory system according to an embodiment.

Referring to FIG. 9, a memory system 2, according to an embodiment, may be operated using the mode register 230 illustrated in FIGS. 7 and 8, and the operation method 900 is described in relation to the ZQ calibration similar to the operation method 500 of FIG. 5.

The operation method 900 of the memory system 2, according to an embodiment, may set the minimum value that may need to be guaranteed for tZQCAL (e.g., 1 μs) and set the minimum value that may need to be guaranteed for tZQLATCH (e.g., 3 ns) in the step S901. In some embodiments, the predetermined minimum values for tZQCAL and tZQLATCH may be stored in the spec register 210 as spec timing values.

The method 500 may measure the actual timing value for the access timing parameter by detecting the timing of the ZQ calibration start command and the timing of the ZQ calibration latch command in step S903. The method may receive a spec timing value (e.g., tZQCAL=1 μs, tZQLATCH=3 ns) defining the effective timing for the access timing parameter in step S905.

Next, the method 500 may compare the measured actual timing value and the spec timing value in step S907. Based on the comparison, the memory device 22 may determine whether it is in a spec-in state or a spec-out state. The memory device 22 may determine that it is in the spec-in state when the actual timing value is included in the effective timing range. Alternatively or additionally, the memory device 22 may determine that it is in the spec-out state when the actual timing value is out of the effective timing range.

When the memory device 22 determines that it is in the spec-in state (e.g., SPEC-IN at step S907), the method 900 may proceed to step S901 may continue to perform the ZQ calibration. Alternatively or additionally, when the memory device 20 determines that it is in the spec-out state (e.g., SPEC-OUT at step S907), the method 900 may store the result of comparing the actual timing value and the spec timing value in the mode register 230 in step S909. For example, the result of comparing the actual timing value and the spec timing value may be stored as a binary value of "0001" in OP[3:0] of the mode register (e.g., mode register 230 of FIGS. 3 and 4).

Next, the method 900, in step S911, may read OP[3:0] of the mode register 230 periodically and/or aperiodically by the host 12 to recognize whether the timing is violated. In step S913, the host 12 may adjust the timing to conform to the spec defining the effective timing.

Next, the method 900, in step S915, may store the time delta value in the mode register 230 described with reference to FIGS. 7 and 8. Thereafter, the method 900 may proceed to step S901 so that the memory device 22 may continue to perform the ZQ calibration.

Figure 10:
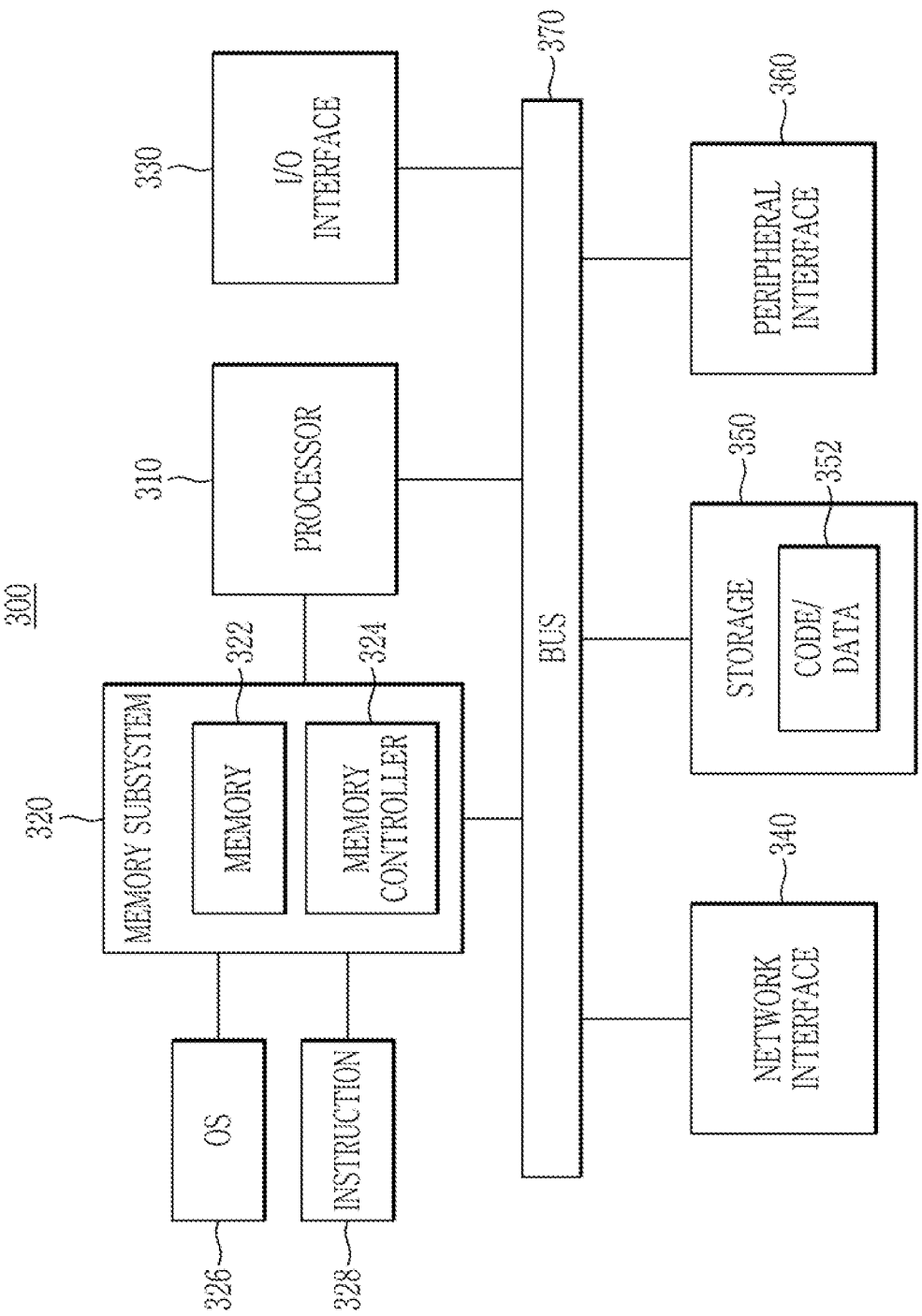
FIG. 10 is a view showing a computing system, according to an embodiment.

FIG. 10 is a view representing a computing system, according to an embodiment.

Referring to FIG. 10, a computing system 300, according to an embodiment, may be a computing device, according to any embodiment described in the present disclosure, such as, but not limited to, a laptop computer, a desktop computer, a server, a game or entertainment control system, a scanner, a copy machine, a printer, a routing or switching device, or any other electronic device. The computing system 300 may include a processor 310 which may provide processing, operation management, and execution of instructions for the computing system 300. The processor 310 may include any type of microprocessor, a CPU, a processing core, or other processing hardware that provides the processing for the computing system 300. The processor 310 may control the entire operation of the computing system 300, may be at least one of programmable general-purpose or special-purpose microprocessors, digital signal processors (DSPs), programmable controllers, application specific integrated circuits (ASICs), programmable logic devices (PLDs), or similar thereto, or combinations of these devices, or a combination of such devices.

The memory sub-system 320 may represent a main memory of the computing system 300, and may provide temporary storage for codes to be executed by the processor 310 and/or data values to be used when a routine is executed. The memory sub-system 320 may include a ROM, a flash memory, one or more of various RAMs, or one or more memory devices such as other memory devices, or combinations of these devices. The memory sub-system 320 may store and/or host an operating system (OS) 326 that provides a software platform for the execution of instructions, particularly, in the computing system 300. Alternatively or additionally, other instructions 328 may be stored in and/or executed from the memory sub-system 320 to provide a logic and processing of the computing system 300. The OS 326 and/or the instructions 328 may be executed by the processor 310.

The memory sub-system 320 may include a memory device 322, where the memory device may store data, instructions, programs, or other items. In an embodiment, the memory sub-system 320 may include a memory controller 324, which may correspond to the host (e.g., host 10 of FIG. 1, host 12 of FIG. 6) according to any embodiment described in the present disclosure, and may include a scheduler that generates and issues commands to the memory device 322.

In an embodiment, the memory sub-system 320 and the memory device 322 may implement timing compensation based on feedback generated through periodic training. For example, the memory device 322 may enter the training state, the memory controller 324 may send the training signal through the interface between the memory device 322 and the memory controller 324 (not shown), and the memory device 322 may not store it in its memory array. In an embodiment, the memory device 322 may evaluate the received training signal for errors. In an embodiment, the memory device 322 may store the training signal in the training buffer, which may be any buffer used to store the training signal, and the memory controller 324 reads the buffered training signal and evaluates the signal for errors. Based on the detected errors, the memory sub-system 320 may adjust one or more parameters of either or both the memory controller 324 or the memory device 322 to compensate for changes in environmental conditions affecting the timing.

The processor 310 and the memory sub-system 320 may be connected to the bus/bus system 370. The bus 370 may correspond to an abstraction representing arbitrary one or more separate physical buses, communication lines/interfaces, and/or point-to-point connections, which may be connected by appropriate bridges, adapters, and/or controllers. Accordingly, the bus 370, for example, may include one or more of a system bus, a peripheral component interconnect (PCI) bus, a hyper transport or industry standard architecture (ISA) bus, a small computer system interface (SCSI) bus, a universal serial bus (USB), or an Institute of Electrical and Electronics Engineers (IEEE) standard 1394 bus ("Firewire"). The buses of the bus 370 may also correspond to interfaces in the network interface 340.

The computing system 300 may also include one or more I/O interfaces 330, a network interface 340, one or more internal large capacity storage devices 350, and peripheral interfaces 360, which are connected to the bus 370. The I/O interface 330 may include one or more interface components (e.g., video, audio, and/or alphanumeric interfacing) through which the user interacts with the computing system 300. The network interface 340 may provide an ability to communicate with remote devices (e.g., servers, other computing devices) to the computing system 300 over at least one network. The network interface 340 may include an Ethernet adapter, wireless interconnection components, a USB, or other wired or wireless standards-based or private interfaces.

The storage 350 may be and/or include any conventional medium for storing large amounts of data in a non-volatile manner, such as at least one magnetic, solid state, or optical based disk, or a combination thereof. The storage 350 may hold codes and/or instructions and data 352 in a persistent state. The storage 350 may be considered generically "a memory", while the memory 320 is an execution and/or operation memory that may provide instructions to the processor 310. for example, the storage 350 may be a non-volatile memory, and the memory 320 may include a volatile memory.

The peripheral device interface 360 may include any hardware interface not specifically mentioned above. The peripheral devices may generally refer to devices that are dependently connected to the computing system 300. In the dependent connection, the computing system 300 may provide a software and/or hardware platform where the operations are executed and that users interact with.

Figure 11:
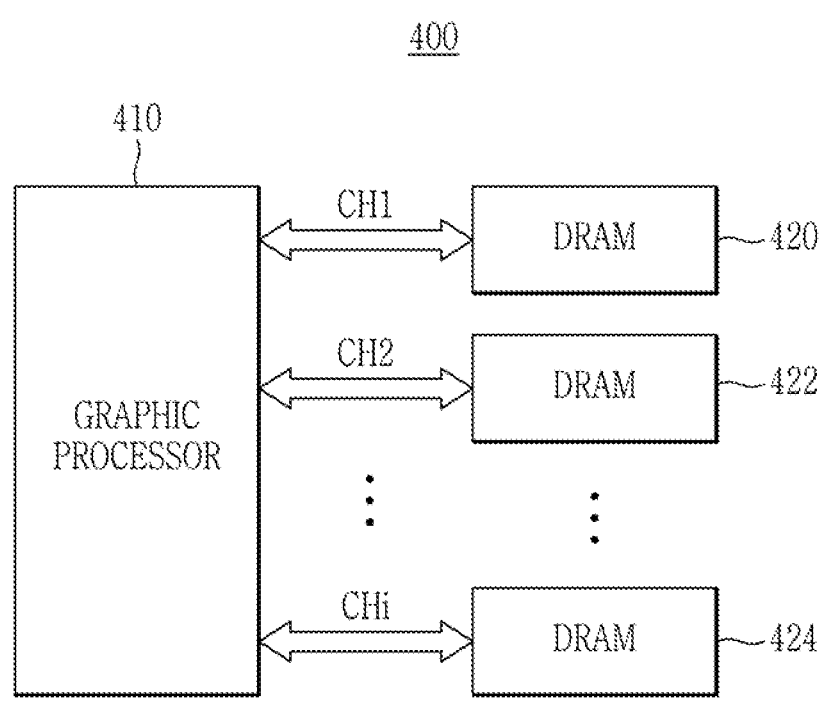
FIG. 11 is a view showing a graphics system, according to an embodiment.

FIG. 11 is a view showing a graphics system according to an embodiment.

Referring to FIG. 11, a graphics system 400 may include a graphics processor 410 and a plurality of DRAM devices 420 to 424. The graphics processor 410 may be configured to perform various arithmetic operations for processing image information. The graphics processor 410 may be connected to a plurality of DRAM devices 420 to 424 through a plurality of channels CH1 to CHi. For example, each of a plurality of channels CH1 to CHi may be a communication channel based on a graphic double data rate (GDDR) interface. In the present disclosure, the graphics processor 410 may correspond to the host 10 of FIG. 1 and/or host 12 of FIG. 6. Each of a plurality of DRAM devices (e.g., 420 to 424) may correspond to the memory device 20 of FIG. 1 and/or the memory device 22 of FIG. 6.

While the present disclosure has been described in connection with what is presently considered to be practical embodiments, it is to be understood that the present disclosure is not limited to the disclosed embodiments. On the contrary, the present disclosure is intended to cover various modifications and equivalent arrangements included within the spirit and scope of the appended claims.

What is claimed is:

1. A memory system, comprising:
a memory device; and
a host configured to:
transmit, to the memory device, a command and address (C/A) signal and a clock signal;
transmit, to the memory device, a first data signal; and
receive, from the memory device, a second data signal,
wherein each command of a plurality of commands that are configured to access the memory device is associated with a corresponding access timing parameter, and wherein the memory device comprises:
an access parameter timer configured to measure an actual timing value of at least one of the access timing parameters associated with the plurality of commands;
a spec register configured to provide a spec timing value defining an effective timing of the at least one of the access timing parameters associated with the plurality of commands;
a comparison circuit configured to compare the actual timing value and the spec timing value; and
a mode register configured to store an access timing violation flag that is read by the host when the actual timing value deviates from the spec timing value by exceeding a predetermined range.

2. The memory system of claim 1, wherein:
the host comprises a mode register reading module configured to detect timing violations by reading the mode register, when a reading condition is met, and
the reading condition comprises at least one of a timing condition and an event condition.

3. The memory system of claim 2, wherein:
the host further comprises a timing controller configured to control transmission timing of the C/A signal after a timing violation is detected.

4. The memory system of claim 1, wherein:
the access timing violation flag is set to read-only to display violation details of a command in which a timing violation is detected.

5. The memory system of claim 1, wherein:
the access timing violation flag is set to write-only to display a command that induces a predetermined operation of the memory device when a timing violation is detected.

6. The memory system of claim 5, wherein:
the predetermined operation comprises an operation that outputs a predetermined value in a predetermined channel and port.

7. The memory system of claim 1, wherein the mode register is further configured to:
store a time delta value; and
control a timing operation of the memory device, according to a timing violation and the time delta value.

8. The memory system of claim 7, wherein the time delta value is set as a percentage value.

9. An operation method of a memory system, comprising:
performing, by a memory device of the memory system, a normal memory access operation comprising at least one of a memory read operation or a memory write operation;
measuring an actual timing value for an access timing parameter in relation to timing assigned to each command of a plurality of commands that are configured to access the memory device;
receiving a spec timing value defining an effective timing of the access timing parameter;
comparing the actual timing value and the spec timing value;
storing, in a mode register of the memory system, a result of the comparing of the actual timing value and the spec timing value, wherein the storing causes a host of the memory system to adjust timing of a first command of the plurality of commands to conform with a spec defining an effective timing of the first command; and
controlling a timing operation of the memory device according to a time delta value received from the host, the time delta value being determined based on the result of the comparing of the actual timing value and the spec timing value.

10. The operation method of the memory system of claim 9, further comprising:
detecting whether a timing violation has occurred by reading the mode register periodically or aperiodically by the host of the memory system.

11. The operation method of the memory system of claim 9, further comprising:
storing, in the mode register, a value indicating violation details of a command in which a timing violation occurred.

12. The operation method of the memory system of claim 9, further comprising:
storing, in the mode register, a value indicating a command that induces a predetermined operation of the memory device when a timing violation is detected.

13. The operation method of the memory system of claim 12, wherein the predetermined operation comprises an operation that outputs a predetermined value in a predetermined channel and port.

14. The operation method of the memory system of claim 9, further comprising:
storing, in the mode register, the time delta value.

15. The operation method of the memory system of claim 14, wherein the time delta value is set as a percentage value.

16. A memory device, comprising:
an access parameter timer configured to measure an actual timing value of an access timing parameter;
a spec register configured to provide a spec timing value defining an effective timing of the access timing parameter;
a comparison circuit configured to compare the actual timing value and the spec timing value;
a first mode register configured to store a first value indicating violation details of a first command in which a timing violation has occurred, when the timing violation has occurred; and
a second mode register configured to store a second value indicating a second command that induces a predetermined operation of the memory device according to the timing violation,
wherein the memory device is configured to:
receive, from a host, a command and address (C/A) signal and a clock signal;
transmit, to the host, a first data signal; and
receive, from the host, a second data signal with the host,
wherein each command of a plurality of commands that are configured to access the memory device is associated with a corresponding access timing parameter.

17. The memory device of claim 16, wherein the predetermined operation comprises an operation that outputs a predetermined value in a predetermined channel and port.

18. The memory device of claim 16, further comprising:
a third mode register configured to store a time delta value,
wherein the memory device is further configured to control a timing operation of the memory device according to the timing violation and the time delta value.

19. The memory device of claim 18, wherein the time delta value is set as a percentage value.

* * * * *